United States Patent [19]

Fernandes

[11] Patent Number: 4,818,990
[45] Date of Patent: Apr. 4, 1989

[54] MONITORING SYSTEM FOR POWER LINES AND RIGHT-OF-WAY USING REMOTELY PILOTED DRONE

[76] Inventor: Roosevelt A. Fernandes, 104 Ruby Rd., Liverpool, N.Y. 13088

[21] Appl. No.: 95,152

[22] Filed: Sep. 11, 1987

[51] Int. Cl.⁴ .......................... G08C 9/06; G08C 19/22
[52] U.S. Cl. ............................ 340/870.07; 340/310 R; 364/433; 364/456
[58] Field of Search ...................... 340/870.07, 870.16, 340/870.17, 945, 946, 947, 310 R, 310 A, 870.24; 364/483, 492, 433, 456; 318/580–582; 342/63; 324/512, 519, 522

[56] References Cited

U.S. PATENT DOCUMENTS

| | | | |
|---|---|---|---|
| 4,299,483 | 11/1981 | Grove et al. | 340/947 |
| 4,384,289 | 5/1983 | Stillwell et al. | 340/870.17 |
| 4,611,207 | 9/1986 | Anderson et al. | 340/870.16 |
| 4,635,055 | 1/1987 | Fernandes et al. | 340/870.17 |
| 4,668,950 | 5/1987 | Russell, Jr. et al. | 340/870.24 |
| 4,700,307 | 10/1987 | Mons et al. | 364/456 |

*Primary Examiner*—Gerald L. Brigance
*Assistant Examiner*—Richard Hjerpe
*Attorney, Agent, or Firm*—Charles S. McGuire

[57] ABSTRACT

A monitoring system using a unique remotely piloted drone with dual counter rotating propellers and carrying electric field sensing, thermal infra-red imaging, video imaging, acoustic and corona discharge sensing equipment. The compact remotely piloted drone flies along a power corridor and is maintained at a fixed distance from an outer phase conductor using on board electric field detection circuitry, video/infra-red imagery and an RF/laser altimeter.

The counter rotating, twin-turbo driven configuration for the propellers mounted on coaxial vertical shafts provides a highly stable platform, unlike conventional manned helicopters presently used for routine right-of-way patrols. Dual, counter-rotating saucer-shaped auxiliary propellers provide a degree of stability far superior to a conventional helicopter, particularly in gusty winds. On board sensors and video cameras would permit electric utilities an economic approach to right-of-way monitoring, inspection of frayed conductors or deteriorated splices through infra-red sensing, detection of cracked insulators through acoustic/corona sensors, monitoring of critical, thermally limiting spans and other monitoring functions.

27 Claims, 4 Drawing Sheets

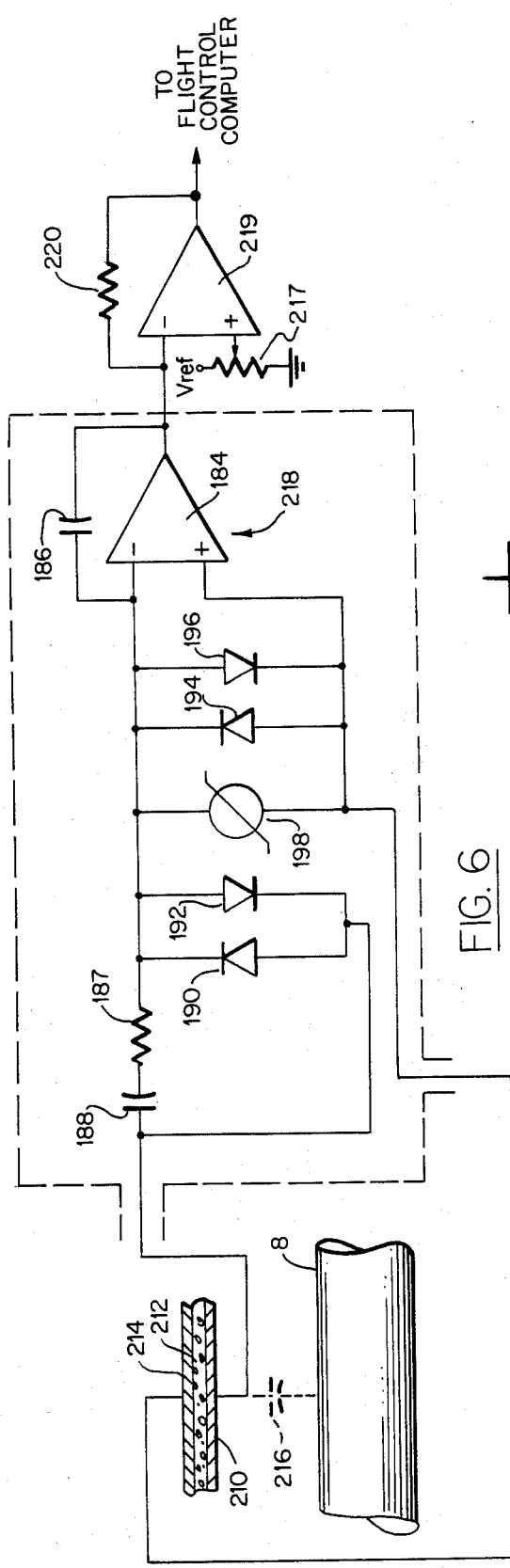
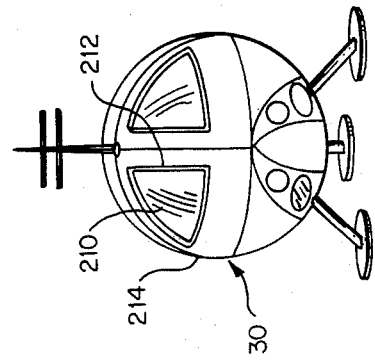
FIG. 5
FIG. 6

MONITORING SYSTEM FOR POWER LINES AND RIGHT-OF-WAY USING REMOTELY PILOTED DRONE

REFERENCE TO RELATED APPLICATIONS

This application is related to U.S. patent applications entitled: Electrical Power Line And Substation Monitoring Apparatus And System, Ser. No. 859,496 filed May 5, 1986; Electrical Power Line Parameter Measurement Apparatus And Systems, Including Compact, Line-Mounted Modules, Ser. No. 859,497, filed May 5, 1986; and Line Mounted Apparatus For Remote Measurement Of Power System or Environmental Parameters At Unlimited Distances Ser. No. 874,520, filed June 16, 1986, all of the present inventor.

BACKGROUND OF THE INVENTION

The present invention relates to a system and method of monitoring physical features of high voltage electrical conductors and/or environmental features along the power corridor through which the conductors extend. More specifically, the invention relates to a power line monitoring system and method utilizing a Remotely Piloted Drone (hereafter "RPD") which is flown along the power corridor and carries one or more pieces of equipment which provide observance and/or measurement of conductor and/or environmental features. In the transmission of electrical power, high voltage conductors are supported on a succession of towers along a power corridor, often extending through geographically remote areas. It is necessary to inspect on a regular basis the physical condition of both the power lines and the corridor through which they extend. For example, the following features are normally monitored at periodic intervals: the condition of the conductor (pitting, fraying, etc.); identification of poor splices; inspection of cracked insulators; location of critical, thermally limiting transmission line segments; tower condition; identification of gas emissions; storm damage inspection; inspection of tree growth; and other right-of-way obstacles.

These functions are performed today through a combination of conventional, manned helicopter fly-overs and foot patrols. Manned helicopters are dangerous to fly along EHV power transmission lines during inclement weather. Manned helicopters are not very good platforms for sensitive infrared sensing equipment, particularly during gusty and stormy weather conditions. Also, conventional helicopters require frequent, expensive maintenance. Foot patrols are obviously very labor intensive, and thus slow and subject to human error.

OBJECTS OF THE INVENTION

The general object of the present invention is to provide a safe, cost-effective, reliable and enhanced capability power transmission line and right-of-way monitoring system. Another object of the invention is to provide means for video imaging, infrared thermal sensing, ultra violet, RF and acoustic sensing for corona detection utilizing a remotely controlled vehicle through uplink terrestrial RF signals or a satellite communications link and a broad band video and data RF downlink through low earth orbit or geosynchronous orbiting satellite or L-band terrestrial RF link.

Yet another object of the invention is to provide a means for detecting cracked insulator strings, frayed power conductors, degraded conductor splices, tower corrosion, tree growth, ground clearances, conductor spacer/damper condition, and critical thermal spans along a transmission line by telemetering video and sensor data in a remotely piloted vehicle to a ground control station.

Still another object of the invention is to provide means for satellite control of an RPD traversing a power transmission corridor using either multiple low orbit satellites or a single geosynchronous ku-band satellite.

Other objects will in part be obvious and will in part appear hereinafter.

SUMMARY OF THE INVENTION

A unique means is provided for electric power utilities to monitor power transmission lines and corresponding rights-of-way using an RPD that is maintained a fixed distance from the power conductors using on-board electrostatic and electromagnetic field, ultra-violet, acoustic, corona RF, infra-red imaging and laser sensing systems to provide both navigation and monitoring functions.

The RPD is equipped with a pair of counter-rotating frisbee/propeller combinations mounted on vertical, coaxial shafts powered by twin-turbo driven engines using Jet A type fuel. With high speed, compact engines rotating in excess of 10,000 rpm, and propeller wing spans of about 6 ft, each with associated 2 ft diameter frisbees mounted on counter-rotating shafts a high degree of stability and safety is obtained. A 150 lb vehicle with a sensor pay load capability of 50 lbs could carry the following equipment and perform the following transmission line corridor monitoring functions in a single 2 hour flight mission:

Thermal infra-red imager for detection of frayed conductors, hot spots due to bad splices, etc.

Video imager for observation of tree growth conditions, conductor sag clearances, right-of-way observations, environmental surveys, storm damage detection, etc.

RF and Acoustic detector to monitor cracked insulator or other corona noise emissions.

Ultra-violet detector to monitor corona discharge light spectra emissions, spark discharge, etc.

Still Camera for high resolution pictures based on detection of problem components by other sensors Electrostatic and optional, back-up electromagnetic field sensors to maintain minimum safe distance from power conductor RF/Laser altimeter for altitude control.

RF telemetry for 2-way communications via geosynchronous/low earth orbit satellites or terrestrial RF communications.

The navigation controls are simplified for the power transmission line application since the conductor itself is a known, continuous path. Prior to each mission the flight path and profile can be pre-programmed into the on-board computer and stored in RAM memory.

This approach to remote power line and power transmission corridor monitoring would be far superior to foot patrols and the more expensive manned helicopter options. The latter also has severe limitations imposed during winter storm conditions. An RPD with the overall system navigation controls and sensor payload described would provide an excellent platform for surveying large transmission corridors safely. A 2-man crew would be adequate to carry the unit in and out of a ground based mobile control van or a regional maintenance shed. Flight controls could be located either in an all-terrain ground vehicle or in regional operating/dispatch centers.

BRIEF DESCRIPTION OF THE DRAWINGS

FIG. 5 is a front, exterior view of the RPD of FIG. 2; and

FIG. 6 is a schematic diagram of an electronic system for maintaining a desired distance between the RPD and the high voltage conductor.

DESCRIPTION OF THE INVENTION

Remotely piloted drone vehicles employing counter-rotating propellers are being developed for airfield damage surveillance by the military. However, the power utility industry requires systems that can be economically operated in a commercial environment and with simplified navigation and control systems employing techniques that take advantage of power system characteristics. Owing to the potential damage that can be caused by an RPD crashing into critical high voltage cross-state transmission lines with the possibility of a state wide power black out, a safe, light weight, easily licensed RPD with simplified operating and maintenance procedures is required. Precise and stable hovering capability with an adequate payload capacity is required.

Figure 1:
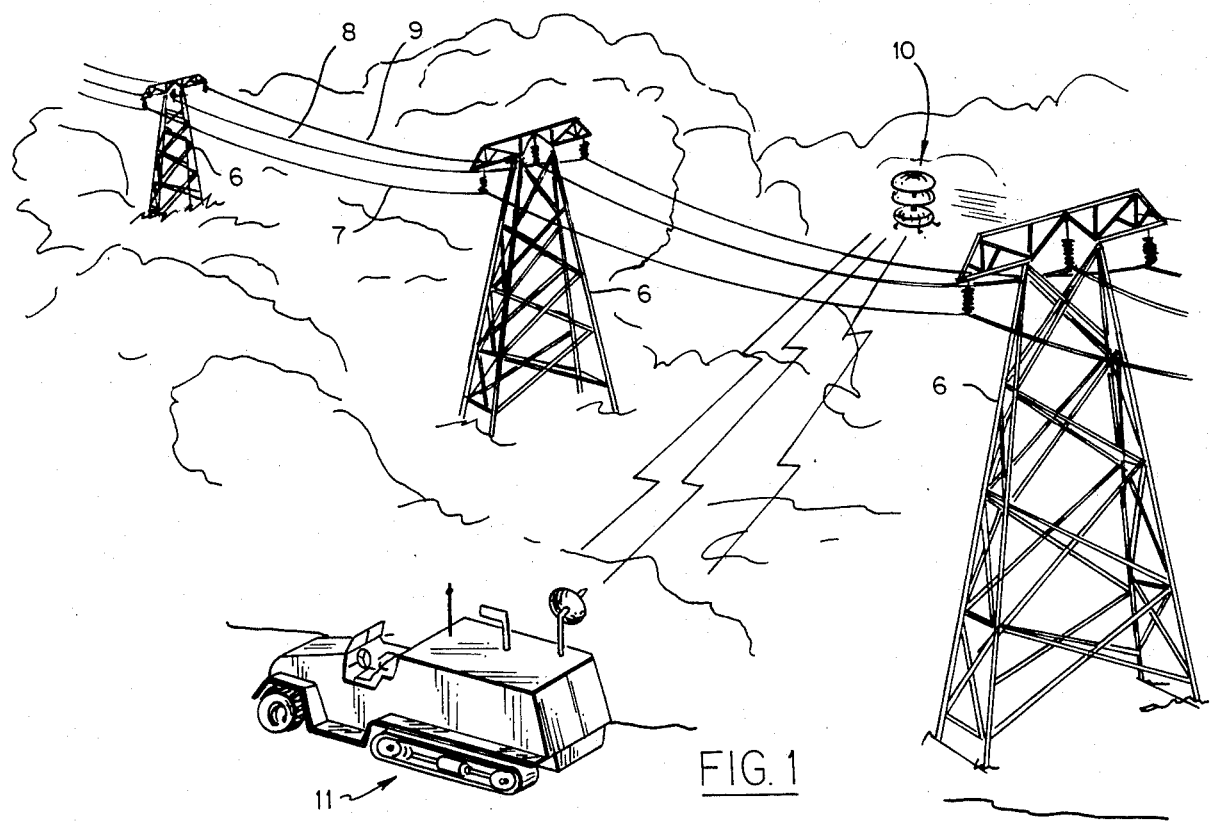
FIG. 1 is a perspective view of a portion of a power transmission line corridor, showing an RPD and ground vehicle linked by RF communications.

Referring now to the drawings, in FIG. 1 is shown a succession of towers 6 supporting conductors 7, 8 and 9 of a three-phase, extra high voltage electrical power transmission system. Conductors 7, 8 and 9 extend along a right-of-way, also termed a power corridor, often through cleared or partially cleared areas of trees and other foliage, as indicated in FIG. 1. As indicated earlier, the present invention is concerned with means for and methods of performing certain monitoring or surveillance functions having to do with the power lines and corridor. To this end, RPD 10, which is described later in more detail, is caused to fly along the power corridor above conductors 7, 8 and 9.

Figure 3:
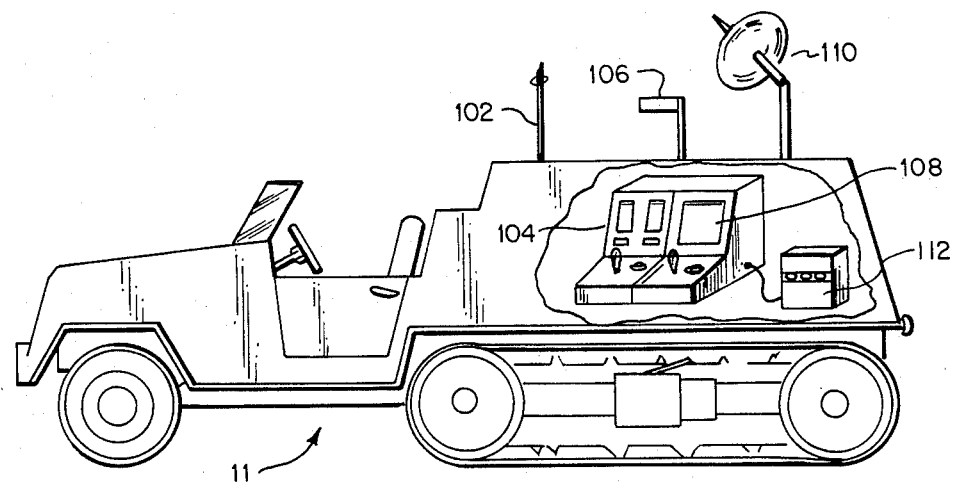
FIG. 3 is a side view, with portions broken away, of an example of the ground-based vehicle and communications and monitoring system.

As will become apparent, RPD 10 is adapted to receive and transmit RF signals for controlling operation of the RPD and monitoring equipment carried thereby, and for relaying data indicative of the monitoring operations, respectively, from and to a ground station. The ground station may be in a fixed, permanent location or, if desirable, may be adapted for movement from place to place as, for example, along the power corridor. Although the latter may, of course, take many forms, a suggested version is shown in FIGS. 1 and 3 in the form of an all-terrain vehicle 11.

Figure 2:
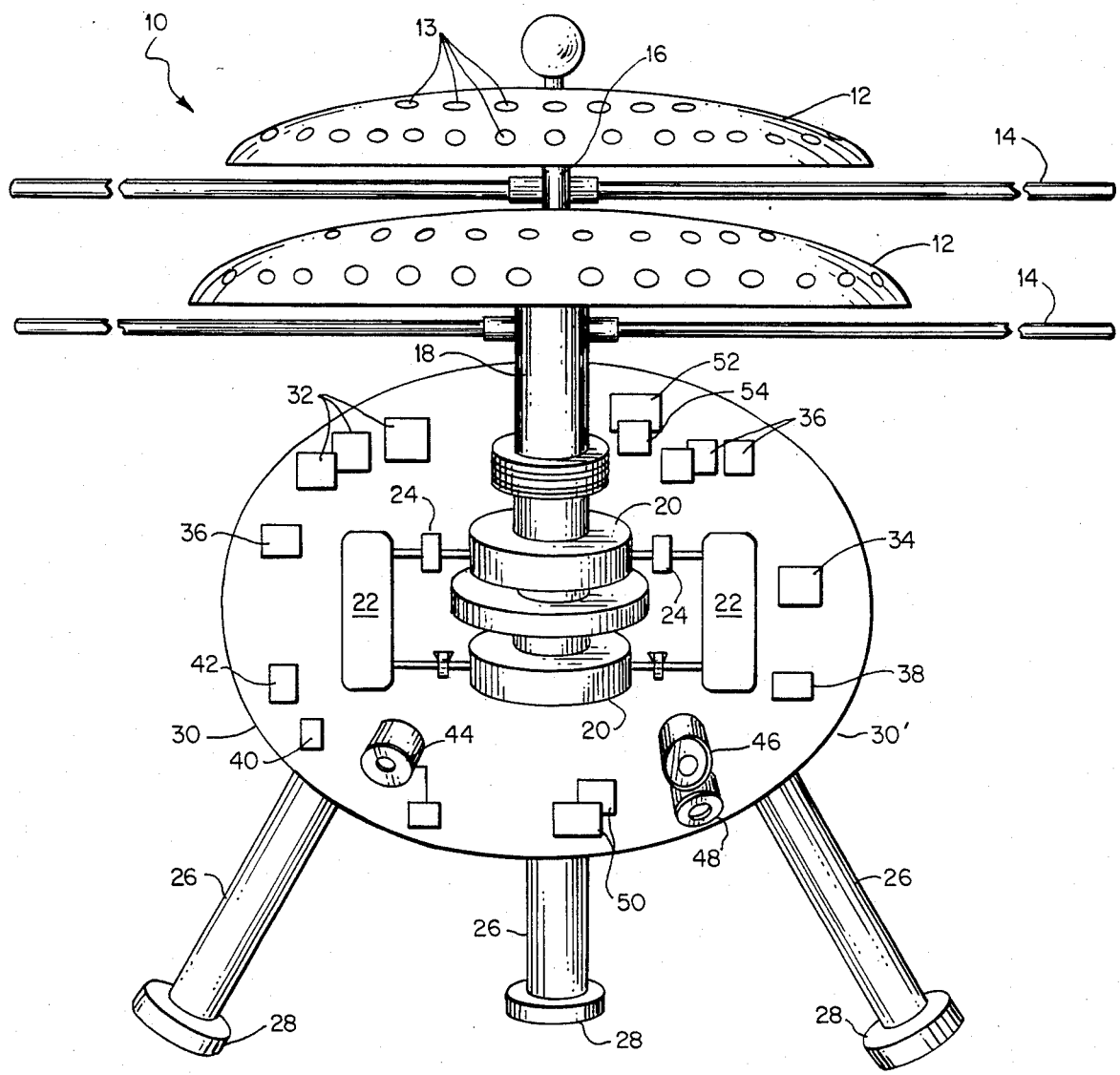
FIG. 2 is a somewhat diagrammatic, front elevational view of an example of RPD for use in the monitoring system of the invention.

The RPD 10, as seen in FIG. 2, comprises two identical, saucer-shaped rotors 12, and associated identical propellers 14. Rotors 12 are a type of structure having high aerodynamic stability when rotated above a minimum speed with the concave surface facing downwardly, being commonly termed and hereinafter referred to as frisbees. The purpose of frisbees 12 is to provide greater inertial stability to RPD 10, particularly when hovering at a substantially fixed position. To reduce the possibility of turbulent or gusty wind conditions causing unwanted movement of the vehicle, frisbees 12 are provided with perforations 13. Alternatively or in addition to the perforations, frisbees 12 may be of relatively shallow configuration. Each combination frisbee/propeller rotor is coupled to a respective one of coaxial, vertical shafts 16, 18, which are driven in a counter rotating manner by a pair of miniature, high speed turbines 20. The frisbee/propeller combinations are coupled so that each rotor may be pitched identically or in a differential mode. Each frisbee/propeller combination may be pitched in synchronism by identical amounts. Vertical ascent is achieved by increasing pitch on both frisbee/propeller combinations simultaneously. Yaw control is obtained by a differential change in collective pitch of the two rotor combinations. Translational control is attained by simultaneously applying a cyclic pitch to both rotor combinations; 360° rotation in azimuth can be achieved through an rpm difference in speeds of the coaxial rotors by placing a slight additional drag on one of the rotors. Fuel is fed to the turbine engines from identical, symmetrically placed high strength, light weight, plastic fuel tanks 22, with fuel pumps 24 ensuring even fuel flow from both tanks so that the weight distribution remains even. A tiroidal tank surrounding the vertical axis of the RPD could be used. Ballasts (not shown) are added, if needed, for weight balance around the shaft axis, depending on the payload. The RPD 10 is ground-supported and landed on tripod feet 26, made of fiberglass, or suitable plastic with impact pads 28.

The spheroidal shaped RPD body 30 is made from a light weight, high strength plastic, or other suitable material and is coated with a metallized surface coat to shield the internal flight control computer 32, power supply 34, communications 36, and payload sensor electronics; namely, electromagnetic and electrostatic field sensors 38, RF and acoustic corona sensor 40, and ultraviolet 42 sensor packages, infrared thermal imager 44, video camera 46 and still camera 48. An RF and/or laser altimeter 50 is provided for altitude control along with altitude sensors 52 which, together with the guidance and navigation cards 54, provide control inputs to the flight control sensor cards and on-board flight control computer 32.

To maximize payload capacity the rotors are made of high strength synthetic materials, e.g., Kevlar, with the landing struts also made of light weight plastic materials. fuel tanks are also constructed of light weight material. The turbines need to produce about 10 hp per lb. A maximum speed of 60 mph with approximately 2-3 hr. endurance per fuel loading is possible.

Good height-hold is obtained either using an advanced, commercially available RF altimeter as backup, with a laser altimeter providing tight control. A laser altimeter would provide altitude control at desired heights anywhere between 50 ft to 100 ft above the power conductor. With stereoscopic video cameras the RPD flight can be controlled from an operator console in a van suitable for utility line patrols, or an all-terrain vehicle 11.

An alternate navigational approach for power utility application would be to pre-program the flight profile on the on-board navigational computer. This is readily accomplished since the power conductors are continuous and follow a known corridor. Data could be fed in from a previous, manned helicopter flight or a previous RPD fly-over manually controlled from an all-terrain vehicle. The pre-programmed flight profile could also serve as a back-up in case there was an uplink communications failure in manually controlled flights. Also, in the event of a communications failure, the RPD could also be pre-programmed to automatically ascend to an altitude of, e.g., 1000 ft or more to re-acquire communications. If this failed to re-establish communications then the pre-programmed flight schedule would be automatically invoked. A second RPD operating in a quasi-stationary mode could serve to relay communications from the RPD performing the actual power line monitoring function.

FIG. 3 shows a suggested example of mobile ground control station 11 for the RPD. RF transmit antenna 102 uplinks control signals from flight control console 104. Antenna 106 receives downlink RF telemetry from RPD 10, including video imagery. Real time video from RPD 10 is displayed on console 108 for operator manual flight control. A window display shows images from the right-of-way and conductor/tower inspection video cameras. Satellite antenna 110 provides an alternative communications means to the RPD at Ku-band. Digital processors 112, in the mobile control van provide digital video data storage. Video tape storage may also be provided. Digital thermal imagery is stored in a similar fashion.

A mobile ground control station would provide extended flight range if only terrestrial RF communications were available between the RPD and ground control station. The flight control console displays navigation and altitude information, along with information on RPD fuel status, speed of craft, alarm status, etc. The control link telemetry is encoded for added security. If the craft is accidentally lost and communications are lost with the command center an emergency transmitter turns on, transmitting its coordinates from on-board navigational data storage.

Figure 4:
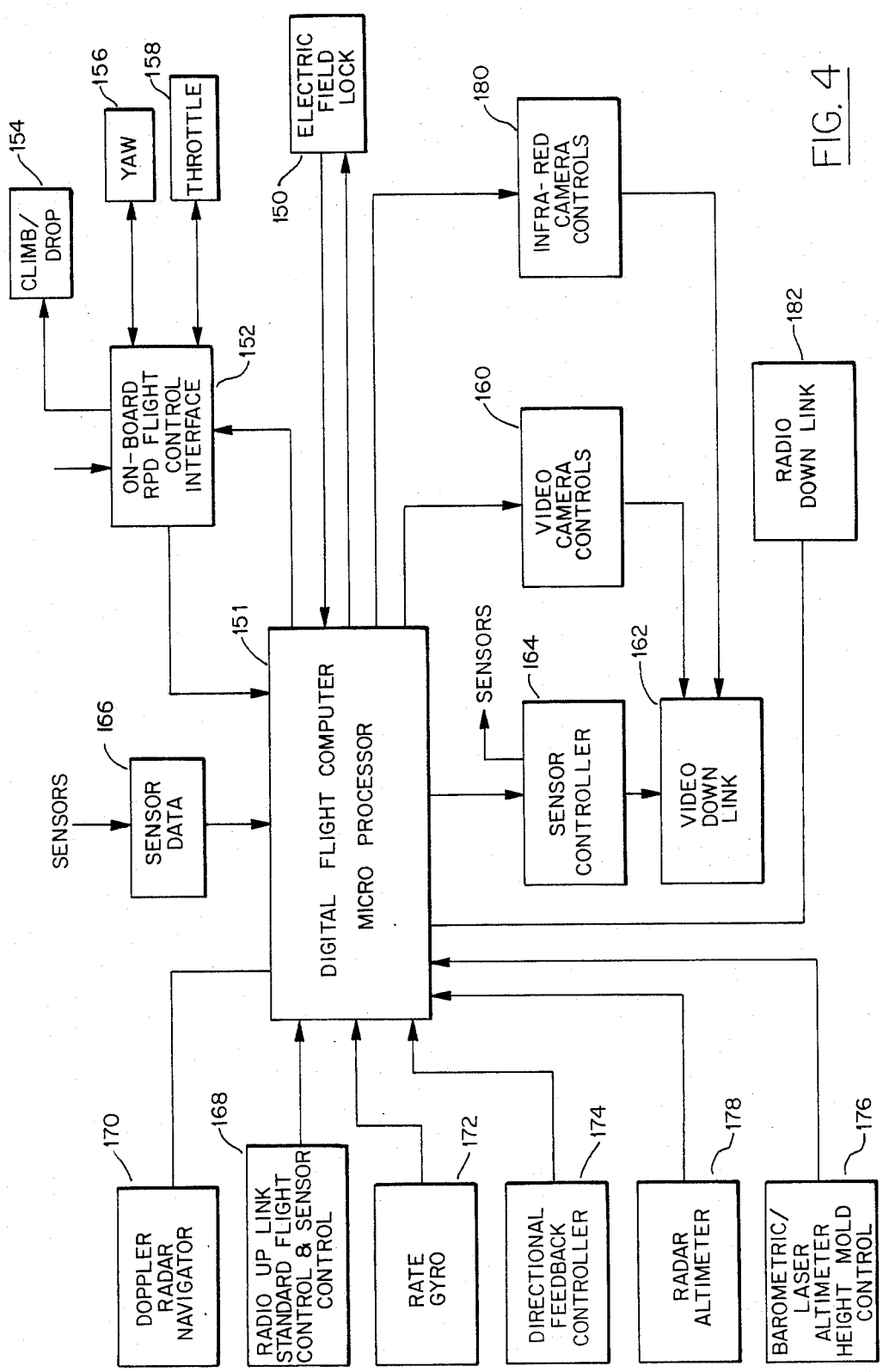
FIG. 4 is a block diagram of sensor, communication and control system of the RPD.

FIG. 4 is a block diagram of an on-board flight control system incorporating an electric field lock which can be remotely set from the ground station during the RPD flight or digitally trimmed after being set prior to flight. This pre-set value is dictated by the voltage of the power conductor and "stand-off" distance selected for the monitoring mission. Closer distances between conductor and RPD may be selected for high resolution, power conductor imagery; and larger stand-off distances for right-of-way condition monitoring, for example, to detect when tree-trimming should occur. The electric field sensor description is provided later.

Flight control information regarding lift/climb or drop control, yaw, 360° azimuth rotation (through small shaft differential speed of counter-rotating shafts), is transmitted to the digital flight control computer 151 through RPD flight control interface 152. These are standard controls available on currently designed RPD's. These signals are fed to the on-board digital flight computer microprocessor which processes the information to control corresponding actuators for lift/climb or drop control 154, yaw control 156 and engine throttle control 158.

Once the RPD is brought to within, say, 50 ft of the desired power line conductor the electric field lock 150 maintains the RPD within a safe envelope away from the conductor. This control loop assists the flight operator at the ground station with visual flight control through the zoom, pan and tilt video camera controls 160, and video downlink communications interface 162. Sensor controller 164 is operated through the on-board computer 151 based on sensor data module 166 input from individual sensors and uplink sensor control module 168 interface.

Other standard flight control functions are performed through doppler radar navigator 170, rate gyro 172, and directional feedback controller 174. Height-lock is achieved through a laser altimeter height hold control module 176 mounted below the RPD body. Infra-red camera controls and downlink communications are provided through module 180 through the on-board computer. Infra-red images are transmitted through the video downlink and allow observation of power conductor temperatures, splice temperatures, connector hot-spots, etc. Other sensor data is telemetered through the RF downlink, communications module 182.

The electric field lock circuitry for module 150 is shown in FIGS. 5 and 6. The body of the RPD is divided into 8 spherical quadrants, Four metallic patches 210 (two of which are seen in FIG. 5) are bonded through a thin dielectric 212 to the metallized surface 214 of the RPD body 30 in the four quadrants the upper half thereof. These patches, together with the dielectric separating them from the metallized surface, form four capacitors which are connected in parallel. Power conductor 8 creates a charging current, on these parallel connected capacitors, through the air dielectric between the metallic power conductor 8 and metallic patches 210 forming capacitors 216, which are correspondingly parallel connected.

An integrator, indicated generally at 218, consisting of operational amplifier 184 and gain control feedback capacitor 186, has one input connected through resistor 187 and capacitor 188 to the outer patch 210 on the RPD body. The other terminal of the operational amplifier is connected to the metallized surface 214 of the RPD body. The low input impedance of operational amplifier 184 and high gain causes the charging current at the surface 210 to flow through the electric field sensing circuitry and then through metallized surface 214 to earth ground. Therefore, the operational amplifier 184 will provide an output AC voltage which is proportional to the electric field strength at the spherical surface of the RPD. Since the RPD body is symmetric, and the voltage level of EHV conductors is closely controlled to ± 3%, the sum of the charging currents of all four parallel capacitors will remain essentially constant for a given power conductor voltage and distance between RPD 10 and power conductor 8.

Resistor 187 is a current-limiting means to protect against fast rise time surges. Capacitor 188 is relatively large e.g., 5-10 Mfd for AC power conductor monitoring, to block DC signals. Diodes 190 and 192 clamp the voltage across resistance-capacitance 187-188; similarly, diodes 194 and 196 clamp the voltage across the inputs of amplifier 218. Metal oxide surge suppressor 198 protects the circuit components against damage due to momentary transients. The output signal representing the voltage value is compared with a preset, digitally derived reference voltage $V_{ref}$ 217 at comparator 219, with feedback resistor 220. The differential output is fed to the flight control computer which maintains the RPD a fixed distance, say, 50 ft from the power conductor.

Thus, the electric field sensing system can be used as an additional aid in flying RPD 10 at a desired distance from the power conductor and to alarm the operator in case a pre-determined safe distance is violated. Additional safety is incorporated by allowing the RPD to be brought to a control landing even with one engine out. On-board data storage of the flight profile will also allow safe return of the RPD, even if primary communications is lost. The digital controller would provide enhanced navigational capability including increased stability. Separate remote control interfaces for the RPD provide good altitude control, heading/directional control is achieved through a proportional control interface. Hovering capability would be excellent even in gusty conditions with digital drift control compensation. The on-board doppler radar system is used to assist the hover function and speed control along the power conductor. Radar position indication could be superimposed on a "moving map display" system on the flight control monitor. This would assist the flight control operator in establishing visual flight position status.

The thermal imaging capability can be used in locating "Power-Donuts" along critical thermal spans of a transmission line by detecting the hottest running spans, and spans with the greatest sag are visually located through the RPD video imager. In a single flight pass, information is also obtained on right-of-way conditions to ascertain need for tree-trimming, etc. Unauthorized changes to the power corridor/right-of-way, forest lumber/foliage patrols, storm damage detection, tower damage detection, and gas pipeline inspection can all be performed with the video imager.

The infra-red thermal sensing system would be a useful tool to detect deteriorating splice joints, frayed conductors, gas pipe line leaks, wet land inventory, cropland inventory and substation equipment hot spots. Transmission line monitoring can be conveniently performed over a wide geographic area with this type of RPD.

The on-board high resolution still camera could be used to obtain detailed photographs of hot-spots, and cracked insulators detected by the thermal imager through a telescoping lens.

Cracked insulators and poor connections are identified by the ultra violet and acoustic detectors. Filtering is provided to eliminate other extraneous noises.

Stereo-plotting and laser height measurements can be used to generate maps of various power corridor options for new construction.

For night time monitoring the RPD could be fitted with a high intensity spot beam. This would also facilitate assessment of storm damage.

The infra-red optics are selected to target a 1" to 2" diameter power conductor of variable emissivity, with a temperature measurement accuracy of 1° C. Temperature gradients need to be detected to within 0.5° C. This data is superimposed on the video imagery to establish location of any detected hot spots.

Corona sensing equipment is selected to detect ultra-violet light emissions, acoustic and RF corona signatures. Incipient faults could be detected through monitoring of weak corona discharge emissions.

Emission sensors could also be placed in an RPD for radiation detection during nuclear emergencies. The RF link could also be used to set up emergency radio communications.

Thus, it is seen that a versatile power transmission line monitoring system and method have been disclosed. Several alternate configurations can be derived from the suggested system for transmission line monitoring using the physical characteristics of typical power conductor systems.

What is claimed is:

1. A system for monitoring physical and/or environmental features and abnormal conditions associated with or in proximity to an energized electric power conductor extending along a power corridor, said system comprising:
   (a) a remotely piloted drone adapted for flight in close proximity to said power conductor and for hovering to detect abnormal conditions along said power conductor;
   (b) said drone including means responsive to control signals from a source outside said drone for guidance thereof along said power corridor;
   (c) at least one piece of equipment mounted upon said drone and adapted to observe and/or record data commensurate with at least one of said features and conditions in a first location along said power corridor; and
   (d) a ground-based control station including means for retrieving said data at a second location, remote from said drone.

2. The monitoring system of claim 1 and further including a flight computer mounted upon said drone and containing pre-programmed data for providing said control signals.

3. The monitoring system of claim 1 wherein said ground-based control station includes signal transmitting means and said drone includes signal receiving means, said transmitting and receiving means adapted to transmit and receive, respectively, said control signals.

4. The monitoring system of claim 1 wherein said control signals comprise electromagnetic field emissions of said energized power conductor.

5. The monitoring system of claim 4 wherein said electromagnetic field emissions include emissions from a superimposed power line carrier signal.

6. The monitoring system of claim 1 wherein said control signals are generated in response to a sensed physical element extending along said power corridor.

7. The monitoring system of claim 1 and further including means mounted upon said drone for detecting the electrostatic field of said power conductor, and for generating said control signals in response to the strength of said field.

8. The monitoring system of claim 7 wherein said equipment comprises a television camera.

9. The monitoring system of claim 8 and further including signal transmitting means mounted upon said drone and adapted to transmit video signals from said television camera for reception and display on a video monitor at said second location.

10. The monitoring system of claim 7 wherein said equipment comprises an infrared camera.

11. The monitoring system of claim 10 and further including means mounted upon said drone for moving said infrared camera to control the direction of view thereof in response to control signals received from said ground-based control station.

12. The monitoring system of claim 7 wherein said drone is spheroidal in external configuration.

13. The monitoring system of claim 12 wherein said drone has an electrically conducting external surface.

14. The monitoring system of claim 13 and further including a plurality of patches of electrically conducting material fixedly bonded to said drone external surface through a relatively thin layer of dielectric material, thereby forming a plurality of parallel connected capacitors, said patches being symmetrically arranged about the vertical axis of said drone.

15. The monitoring system of claim 14 wherein said drone is so spaced from said energized power conductor that the electrostatic field associated with said conductor creates a charging current on said capacitors through the air dielectric between said conductor and said patches.

16. The monitoring system of claim 15 and further comprising an integrator including an operational amplifier having first and second inputs respectively connected to said drone external surface and to one of said patches, whereby said amplifier will provide an AC output voltage which is proportional to the electric field strength at said drone external surface.

17. The monitoring system of claim 16 wherein said integrator further includes a gain control feedback capacitor, said amplifier having a low input impedance and high gain.

18. The monitoring system of claim 17 and further including a flight control computer mounted in said drone for generating said control signals, and said output voltage is provided as an input to said computer.

19. The monitoring system of claim 18 and further including means providing a preset reference voltage and a comparator for comparing said output voltage with said reference voltage and generating a differential output commensurate therewith, said differential output being provided as said computer input.

20. The monitoring system of claim 12 wherein said drone is propelled by a pair of coaxially mounted, counter-rotating rotor structures.

21. The monitoring system of claim 20 wherein each of said rotor structures comprises a propeller and an inverted, saucer-shaped element.

22. The monitoring system of claim 21 wherein the weight of said drone, including all contents thereof, is substantially equally distributed about the central axis thereof, said rotor structures being rotatable about said central axis.

23. The monitoring system of claim 21 and further including liquid fuel container means mounted on said drone for supplying fuel to motive means for said rotors, and means for withdrawing fuel from said container means in such a way as to maintain said substantially equal distribution of weight about said central axis.

24. A method of monitoring physical and/or environmental features and conditions associated with or in proximity to an energized electric power conductor extending along a power corridor, said method comprising:
    (a) mounting at least one piece of equipment adapted to perform a monitoring function upon a remotely piloted drone having motive means for flight along said power corridor;
    (b) mounting altitude, directional and velocity control equipment for said drone thereupon, said control equipment being adapted for operation from a ground-based control station;
    (c) causing said drone to fly in a desired path extending in general proximity to said power conductor;
    (d) generating data commensurate with said monitoring function representative of at least one of said features and conditions in a first location along said power corridor; and
    (e) retrieving said data at said ground-based control station.

25. The monitoring method of claim 24 wherein said monitoring equipment is of the type having a viewing direction, and further including the step of controlling the direction of view of said monitoring equipment by signals transmitted from said ground-based control station.

26. The monitoring method of claim 25 and including the further step of guiding said drone along said power corridor in response to the strength of the electrostatic field associated with said energized power conductor.

27. The monitoring method of claim 26 and including the further steps of transmitting signals from a ground-based station, receiving said signals at said drone, and using said signals to control operation of both said monitoring equipment and said control equipment.

* * * * *